United States Patent [19]

Akashi

[11] Patent Number: 4,999,807
[45] Date of Patent: Mar. 12, 1991

[54] DATA INPUT CIRCUIT HAVING LATCH CIRCUIT

[75] Inventor: Mineo Akashi, Tokyo, Japan

[73] Assignee: NEC Corporation, Tokyo, Japan

[21] Appl. No.: 148,309

[22] Filed: Jan. 25, 1988

[30] Foreign Application Priority Data

Jan. 25, 1987 [JP] Japan .................. 62-14944

[51] Int. Cl.$^5$ .................. G06F 3/00; G06F 13/00
[52] U.S. Cl. .................. 364/900; 364/939; 364/950; 364/950.4
[58] Field of Search ... 364/200 MS File, 900 MS File, 364/483, 487, 486; 375/4

[56] References Cited

U.S. PATENT DOCUMENTS

| | | | |
|---|---|---|---|
| 2,957,163 | 10/1960 | Kodis | 364/900 |
| 3,345,616 | 10/1967 | Avril et al. | 364/900 |
| 4,176,400 | 11/1979 | Heckel | 364/900 |
| 4,200,929 | 4/1980 | Davidjuk et al. | 364/200 |
| 4,377,843 | 3/1983 | Garringer et al. | 364/200 |
| 4,625,283 | 11/1986 | Hurley | 364/483 |
| 4,641,246 | 2/1987 | Halbert et al. | 364/487 |
| 4,649,512 | 3/1987 | Nukiyama | 364/900 |
| 4,654,584 | 3/1987 | Gyles | 364/487 |
| 4,718,036 | 1/1988 | Halbert et al. | 364/487 |

*Primary Examiner*—Michael R. Fleming
*Assistant Examiner*—Gopal C. Ray
*Attorney, Agent, or Firm*—Sughrue, Mion, Zinn Macpeak & Seas

[57] ABSTRACT

A data input circuit provided in a data processing equipment is disclosed. The input circuit includes a timing circuit generating a latch pulse in asynchronism with a read request signal generated by a CPU and a latch circuit latching input data in response to the latch pulse. The data latched in the latch circuit is transferred to a data bus in response to the read request signal. The input circuit further includes circuitry responsive to an access by the CPU for delaying the generation of the latch pulse such that the latch pulse is generated after the CPU stops to generate the read request signal. The latch circuit is thereby prevented from latching the input data while the read request signal is generated.

9 Claims, 5 Drawing Sheets

DATA INPUT CIRCUIT HAVING LATCH CIRCUIT

BACKGROUND OF THE INVENTION

The present invention relates to a data input circuit provided in a data processing equipment and more particularly to such an input circuit having a latch circuit latching input data in asynchronism with a read request signal generated by a central processing unit (called hereinafter "CPU").

A data input circuit is interposed between one or more input terminals and a CPU. It receives the input data at the input terminals, latches the input data and, when CPU generates a read request signal, transfers the latched input data to the CPU in response thereto. Since the CPU generates the read request signal in accordance with programs to be executed, the read request signal is in asynchronism with the input data latching timing. For this reason, there occurs a case where the input circuit latches new input data while the CPU generates the read request signal. In this case, data to be supplied to the CPU is changed during the data read operation of the CPU. An error operation thereby occurs.

SUMMARY OF THE INVENTION

Therefore, an object of the present invention is to provide a data input circuit having a latch circuit, which is free from simultaneous occurrence of an input data latching operation and a data output operation.

Another object of the present invention is to provide an input circuit which does not change data to be supplied to a CPU during the data read operation of the CPU.

An input circuit according to the present invention comprises at least one input terminal supplied with input data, at least one output terminal, a latch circuit having input and output nodes and latching data at the input node in response to a latch-enable signal, means for coupling the input terminal to the input node of the latch circuit, a timing circuit producing the latch-enable signal in a predetermined cycle of period, a buffer circuit receiving a read request signal and coupling the output node of the latch circuit to the output terminal when the read request signal takes an active level, and means coupled to the timing circuit for inhibiting the latch-enable signal from being produced until the read request signal takes an inactive level.

When the read request signal takes the inactive level, the buffer circuit is inactivated to disconnect the output node of the latch circuit from the output terminal. In this case, the latch circuit cyclically latches the input data in response to the latch-enable signal. When the read request signal takes the active level, the buffer circuit couples the output node of the latch circuit to the output terminal to transfer the latched-data to the output terminal. At this time, even if the timing circuit intends to produce the latch-enable signal, the gate means intercepts the production of the latch-enable signal. After the read request signal change to the inactive level, the latch-enable signal is produced. Therefore, the data transferred to the output terminal does not change while the read request signal takes the active level.

BRIEF DESCRIPTION OF THE DRAWINGS

The above and other objects, features and advantages of the present invention will be more apparent from the following description taken in conjunction with accompanying drawings, in which.

DETAILED DESCRIPTION OF THE INVENTION

Figure 1:
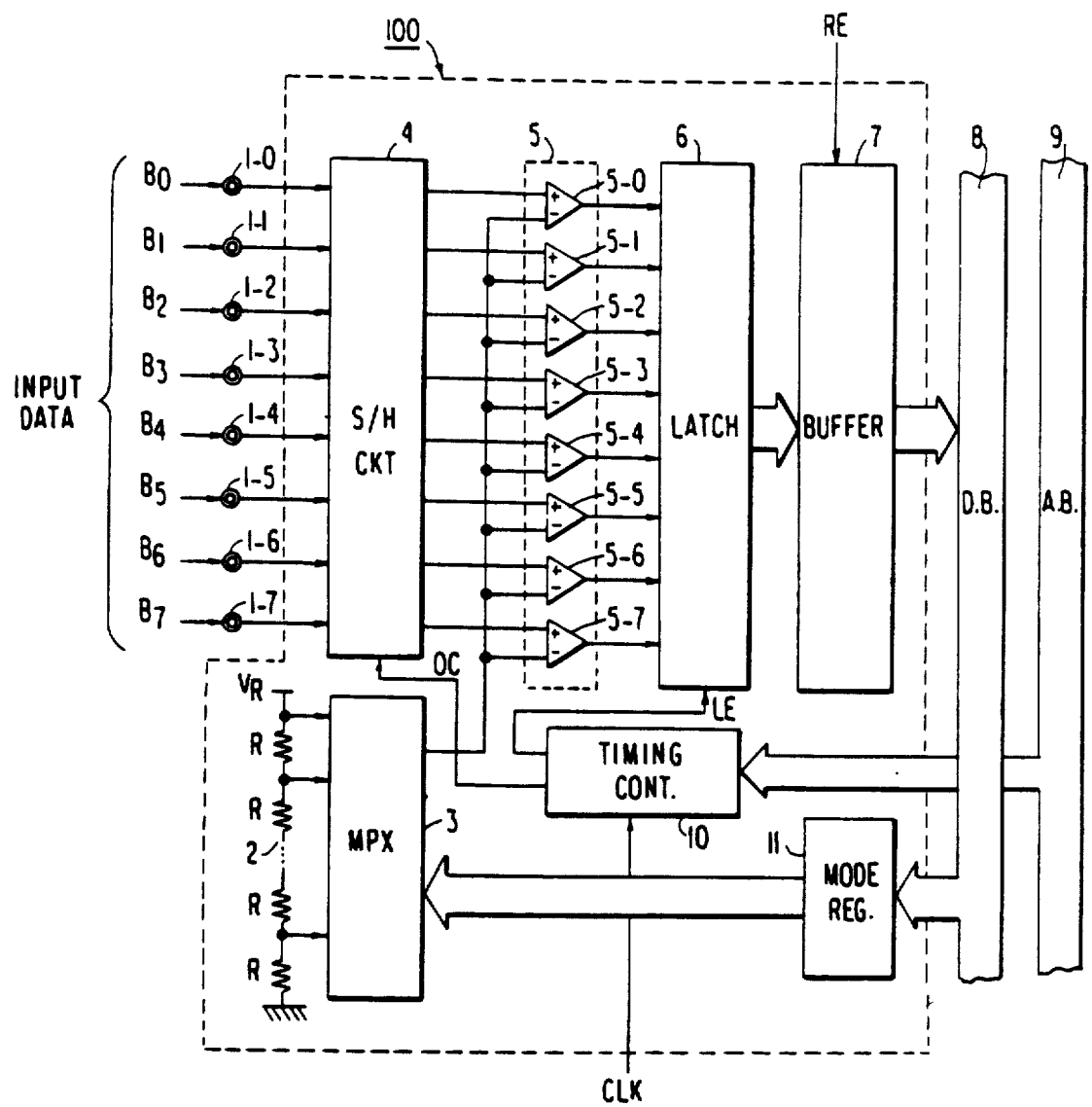
FIG. 1 is a block diagram representative of an embodiment of the present invention.

Referring to FIG. 1, an input circuit according to an embodiment of the present invention is shown by a reference numeral 100 and includes eight input terminals 1-0 to 1-7 supplied with input data consisting of eight bits $B_0$ to $B_7$. Each bit of the input data has data "1" or data "0", but the potential thereof takes an intermediate level between logic "1" and logic "0" of a data signal treated by a CPU (not shown in FIG. 1). For this reason, the input data cannot be transferred to a data bus 8 as they are. In order to solve this problem, the input circuit 100 has a level convention circuit for converting the intermediate level of each bit of the input data into a logic level required by the CPU. The level convertion circuit includes a resistor ladder circuit 2, a multiplexer 3, a sample-hold (S/H) circuit 4, a comparison circuit 5, and a mode resistor 11. The resistor ladder circuit 2 has a plurality of resistors R connected in series between a reference voltage point $V_R$ and a ground point and produces a plurality of reference voltages having levels different from one another, which are in turn supplied to the multiplexer 3. The multiplexer selects one of the reference voltages in response to data stored in the mode registor 11 and supplies the selected reference voltage to an inverting input terminal of each of eight comparators 5-0 to 5-7 in the comparison circuit 5. The data to be stored in the register 11 is set by the CPU via a data bus 8. The sample-hold circuit 4 has a switch and a storage capacitor (both not shown) with respect to each input terminal 1, as well-known in the art, and is controlled by an operating control signal OC. When the signal OC takes a low level, the switch is turned ON to charge the storage capacitor to a level corresponding to the data of each bit. Thus, the level of each bit of the input data is sampled by the circuit 4. When the signal OC takes a high level, the switch is turned OFF to disconnect the storage capacitor from the associated input terminal 1. The input data level is thereby held by the storage capacitor and then supplied to a non-inverting input terminal of the associated one of the comparators 5-0 to 5-7. The multiplexer 3 selects such a reference voltage that takes an intermediate level between data "1" and data "0" of the input data. Thus, each bit of the input data is converted into a level of logic "1" or logic "0" required by the CPU. The data derived from the comparison circuit 5 is supplied to a set of input nodes of a latch circuit 5 which latches the supplied data in response to a latch-enable signal LE. The signal LE is produced just before the operating control signal OC changes to the low level, i.e. just before the data sampling operation starts. The operating control signal OC and the latch-enable signal LE are generated by a timing control circuit 10.

Figure 6:
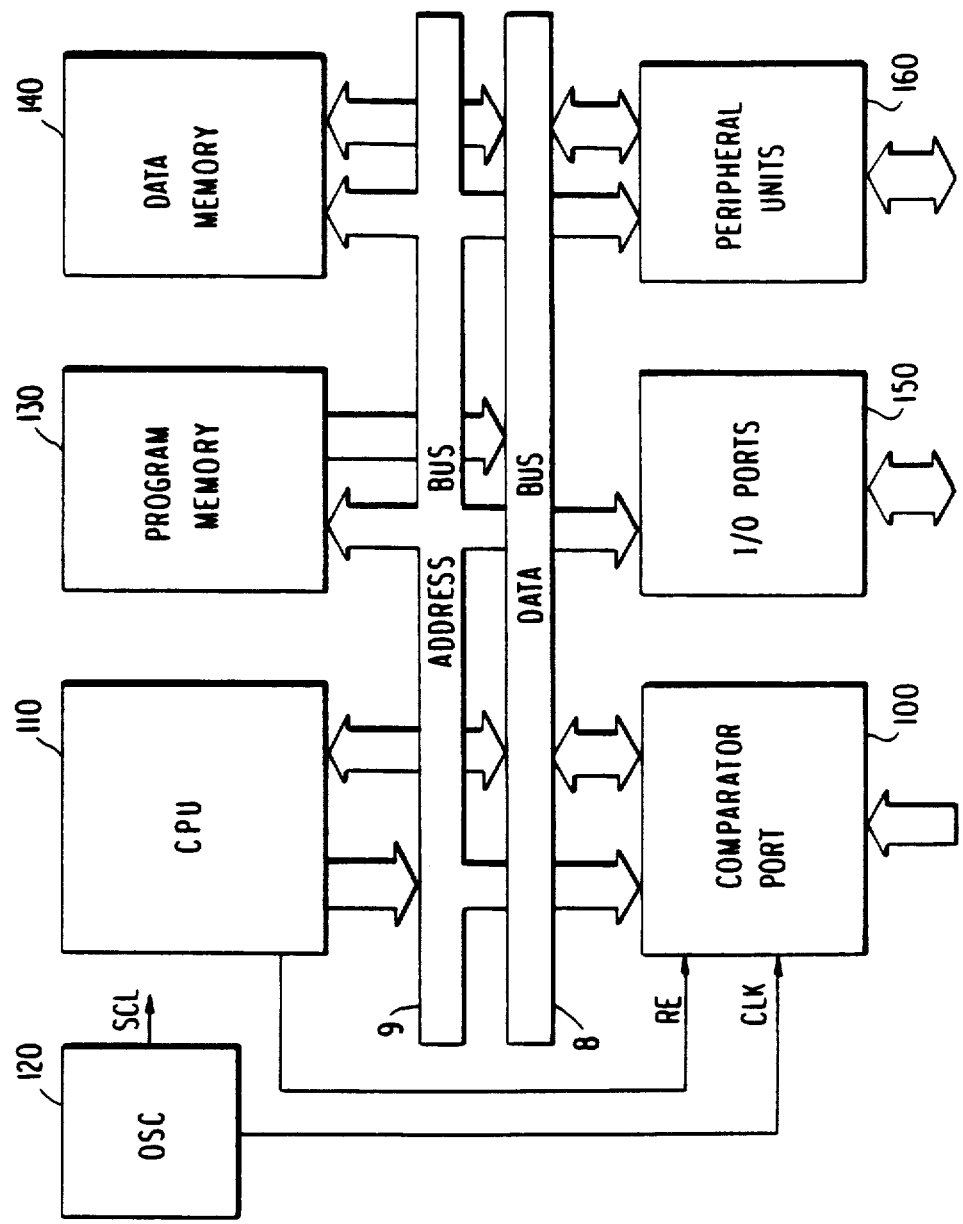
FIG. 6 is a block diagram representative of a data processing equipment employing an input circuit of the present invention.

Since the input circuit 100 has the comparison circuit 5, it is called a comparator port in a data processing equipment, as shown in FIG. 6. The data processing equipment shown in this figure includes a CPU 110 executing instructions, a clock generator generating a system clock SCL, a program memory (ROM) 130 storing instructions to be executed, a data memory (RAM) 140 storing various data, a plurality of input-/output ports 150, and peripheral units 160 having an interrupt control unit, a timer unit, a counter unit, a serial data input/output unit, etc. When an instruction to be executed has information representative of reading of input data supplied to the comparator port 100 (i.e., the input circuit shown in FIG. 1), the CPU 110 generates address information to select the comparator port 100, followed by the generation of a read request signal RE. The comparator port 100 is thereby selected and a bus buffer circuit 7 therein (see FIG. 1) is activated to couple a set of output nodes of the latch circuit 6 to the data bus 8. The data latched in the latch circuit 6 is thus transferred to the data bus 8.

The operation speed of the sample-hold circuit 4 and the comparison circuit 5 is relatively slow. Therefore, if the timing control circuit 10 generates the operation control signal OC and the latch-enable signal LE in response to the selection of the input circuit 100, a considerably long time is required to supply the input data to the CPU. In order to overcome the problem, the timing circuit 10 cyclically generates the signals OC and LE in response to a clock signal CLK supplied from the clock generator 120 (FIG. 6). As a result, the input circuit 100 can transfer the input data to the data bus 8 immediately after the CPU 110 selects the input circuit 100. Since the timing circuit 10 cyclically generates the latch-enable signal LE, the latch circuit 6 latches the data from the comparison circuit 5 (i.e., the input data) in asynchronism with the read request signal RE from the CPU 110.

Figure 2:
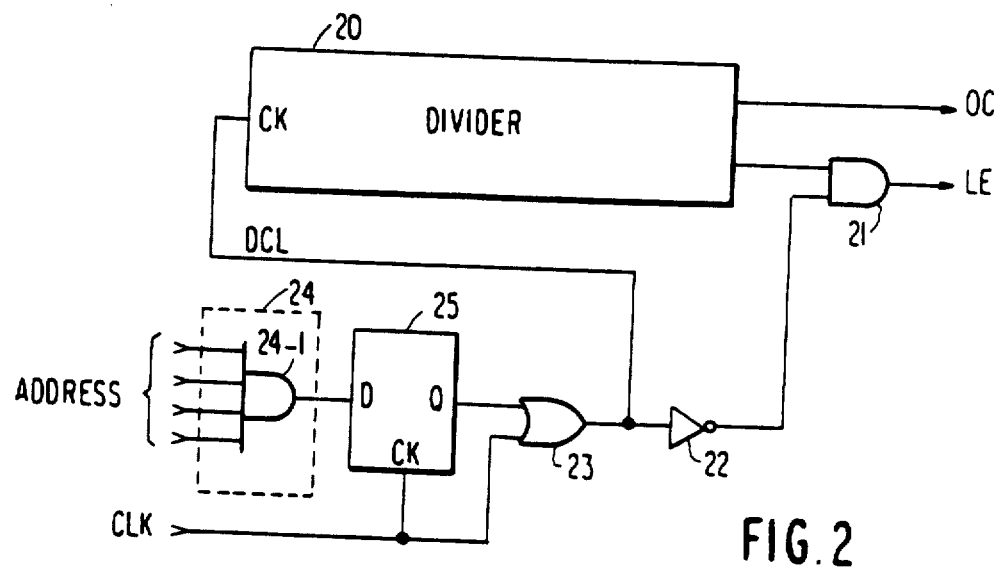
FIG. 2 is a circuit diagram representative of the example of a timing control circuit shown in FIG. 1.
Figure 3A:
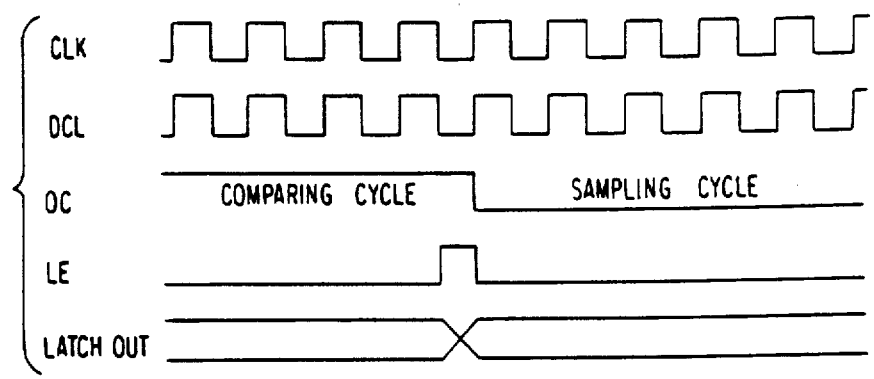
FIGS. 3A and 3B are timing charts denoting an operation of circuits shown in FIGS. 1 and 2.

Referring to FIG. 2, the timing control circuit 10 includes a divider 20, an output of which is used as the operating control signal OC. The clock signal CLK is supplied via an OR gate 23 to the divider as a division clock signal DCL. Therefore, the level of the operating control signal OC is changed every time when a predetermined number of clock pulses are supplied to the divider 20. The clock signal CLK is further supplied via an inverter 22 to one input terminal of an AND gate 21, the other input terminal of which is supplied with a carry signal from the divider 20, this carry signal being utilized to change the level of the operating control signal OC. The output of the AND gate is used as the latch-enable signal LE. Accordingly, the latch-enable signal LE is generated just before the operating control signal OC changes from the high level to the low level, as shown in FIG. 3A. As described above, the high level period of the operating control signal OC is used as a "comparing cycle" and the low level period thereof is used as a "sampling cycle". The output of the comparison circuit 5 is thus latched in the latch circuit 6 just before the sampling cycle starts.

Since the generation of the latch-enable signal LE is asynchronous with the generation of the read request signal RE, the latch-enable signal happens to be generated while the read request signal RE is generated. In this case, the data on the data bus 8 is changed to cause a missoperation of the CPU 110.

Figure 3B:
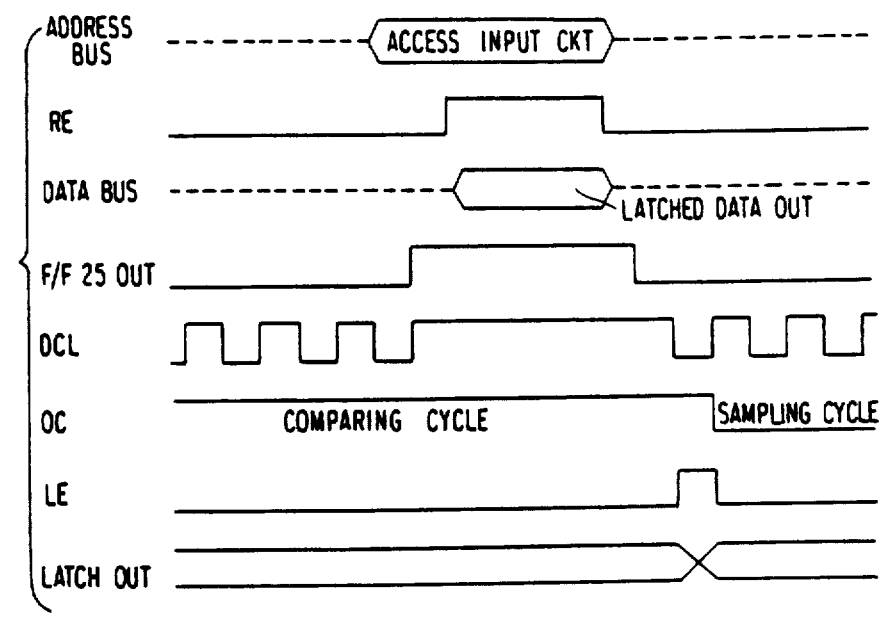

In order to overcome this drawback, the timing control circuit 10 further includes an address decoder 24 and a flip-flop (F/F) circuit 25 in accordance with the present invention. The decoder 24 is constituted of an AND gate 24-1 supplied with address information. The output of the decoder 24 is supplied to a data input terminal D of the F/F circuit 25 having a clock terminal CK supplied with the clock signal CLK and an output terminal Q connected to a second input terminal of the OR gate 23. When the CPU 110 outputs the address information on the address bus 9 to access the input circuit 100, the decoder 24 decodes the address information and produces a high level output. The F/F circuit 25 produces a high level output Q. As a result, the output of the OR gate 23 is fixed to the high level, so that the clock signal CLK is prevented from being supplied to the divider 20, as shown in FIG. 3B. The division operation of the divider 20 stops, thereby the operating control signal OC maintaining a high level, as shown in FIG. 3B. The CPU 110 generates the read request signal RE after the generation of the address information. The buffer circuit 7 thereby couples the latch circuit 6 to the data bus 8. Thus, the data latched in the latch circuit 6 is transferred to the data bus 8. When the CPU 110 catches the data on the data bus 8, it changes the read request signal RE to an inactive level (a low level) and stops to generate the address information. The outputs of the decoder 24 and the F/F circuit 25 are thereby changed to the low level to allow the divider 20 to receive the clock signal CLK. Thus, the divider 20 starts to divide the clock signal CLK, so that the operating control signal OC is changed to the low level and the latch-enable signal LE is generated, as shown in FIG. 3B. The latch circuit 6 latches new input data. Thus, although the latch-enable signal LE is generated in asynchronism with the read request signal RE, the signal LE is prevented from being generated while the read request signal RE is generated.

Figure 4:
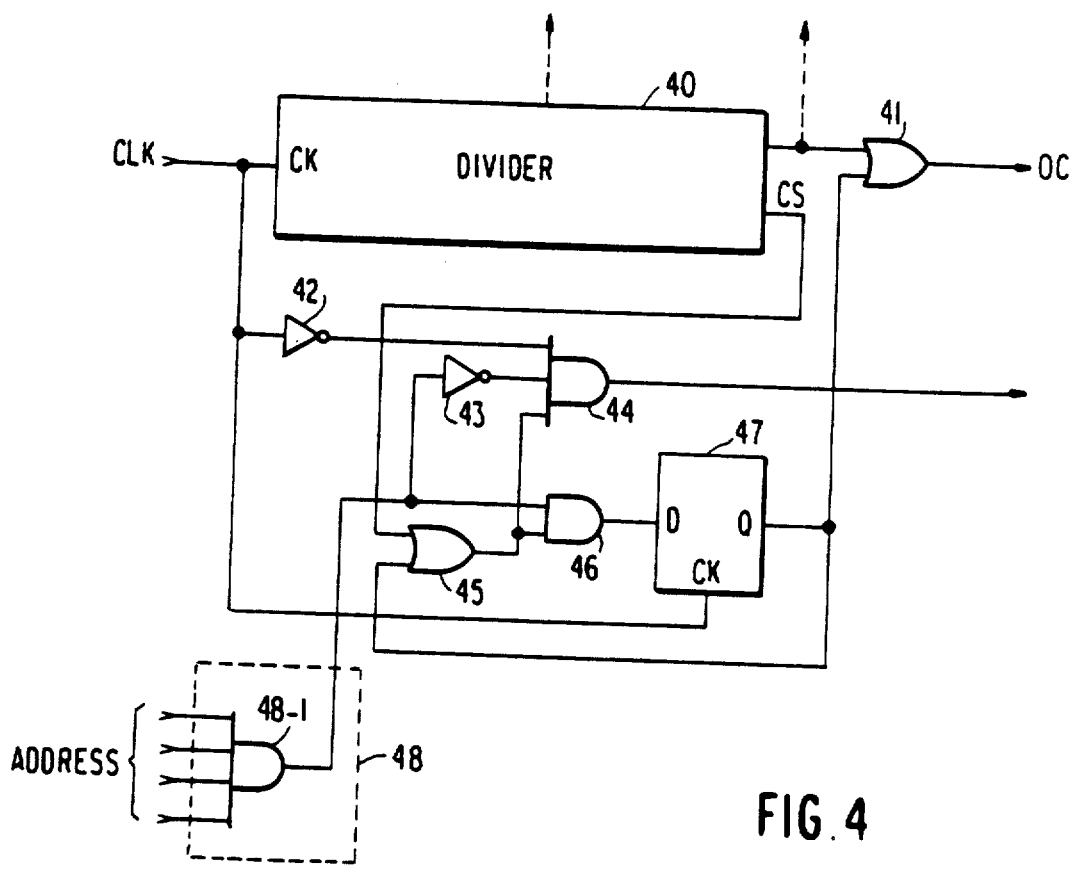
FIG. 4 is a circuit diagram representative of another example of a timing control circuit shown in FIG. 1.

The timing control circuit 10 can use a divider provided in the peripheral units 160 (FIG. 6) in place of the divider 20 shown in FIG. 2. A circuit construction for this purpose is shown in FIG. 4 as another embodiment of the present invention. In FIG. 4, a divider 40 is provided in the peripheral units 160, and therefore the clock signal CLK is directly supplied to the divider 40 and one or more outputs are derived from a predetermined stage of the divider as shown by dotted lines. The output of the divider 40 is supplied to a first input of an OR gate 41, an output of which is used as the operating control signal OC. A second input of the OR gate 41 is supplied with a Q output of an flip-flop (F/F) circuit 27 having a clock terminal CK supplied with the clock signal CLK and a data input terminal D supplied with an output of an AND gate 46. The first input of the AND gate 46 is supplied with an output of a decoder 48 including an AND gate 48-1 supplied with address information, and the second input thereof is supplied with a carry signal CS from the divider 40 via an OR gate 45, this carry signal CS-being used to change the output of the divider 40 from the high level to the low level. The output of the F/F circuit 47 is further supplied to the OR gate, the output of which is supplied to an AND gate 44. The AND gate 44 further receives the clock signal CLK and the output of the decoder 48 via inverters 42 and 43, respectively. The output of the AND gate 44 is used as the latch-enable signal LE.

Figure 5A:
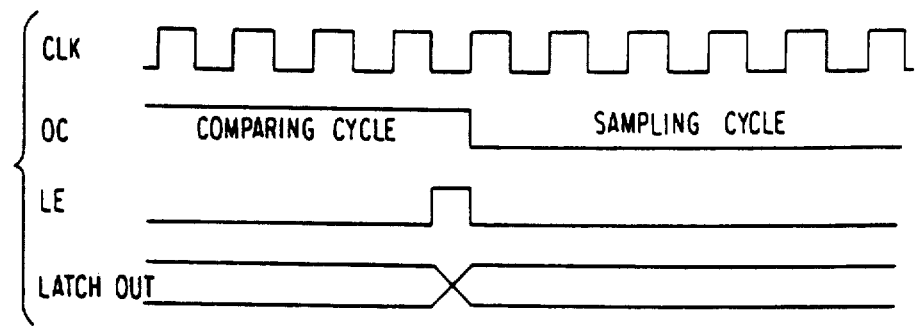
FIGS. 5A and 5B are timing charts denoting an operation of circuits shown in FIGS. 1 and 4.

When the CPU 110 does not access the input circuit (comparator port) 100, both of the outputs of the decoder 48 and the F/F circuit 47 take the low level, so that the operating control signal OC changes its level in accordance with a division ratio of the divider 40 and a latch-enable signal LE is generated just before the signal OC changes the high level to the low level, as shown in FIG. 5A.

Figure 5B:
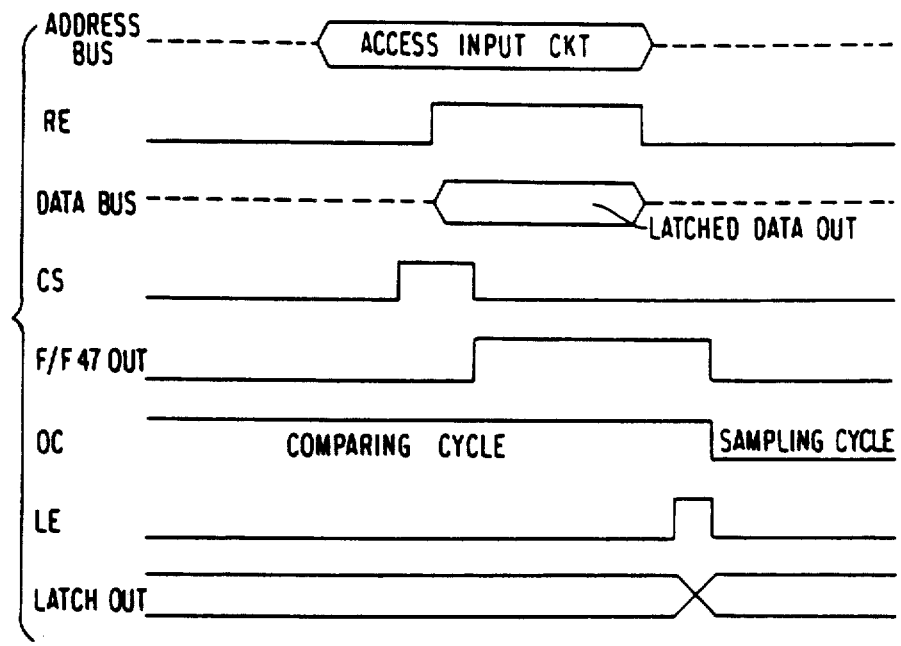

When the CPU 110 generates address information to the address bus 9 to access the input circuit 100, the decoder 48 produces a high level output. At this time, since the clock signal CL is directly supplied to the divider 40, the carry signal CS for changing the output of the divider 40 from the high level to the low level may be derived from the divider 40, as shown in FIG. 5B. However, the high level output of the decoder 48 is inverted by the inverter 43, so that the AND gate 44 receives the low level at one input thereof. Accordingly, the output of AND gate 44 is held to the low level, even if the carry signal CS is derived from the divider 40. No latch-enable signal LE is thereby generated, as shown in FIG. 5B. The carry signal CS derived from the divider 40 is supplied via the OR gate 45 to the AND gate 46, so that the F/F circuit 47 produces a high level output, as shown in FIG. 5B. This high level output is supplied to the OR gate 41. Therefore, the operating control signal OC is maintained to the high level, even when the output of the divider 40 changes to the low level, as shown in FIG. 5B. The CPU also generates the read request signal RE, so that the data latched in the latch circuit 6 is transferred to the data bus 8. Since the high level output of the F/F circuit 47 is fed back to the OR gate 45, the data input D of the F/F circuit 47 receives the high level even when the carry signal CS disappears.

When the CPU catches the data on the data bus 8, it changes the read request signal RE to an inactive level and the address information on the address bus 9 to other information. The decoder 48 produces the low level output and the AND gate receives the high level via the inverter 43. Therefore, the latch-enable pulse LE is generated from the AND gate in response to the low level of the clock signal CLK. When the clock signal CLK changes from the low level to the high level, the F/F circuit 47 introduces the low level input and changes its output to the low level. As a result, the output of the OR gate 41 changes to the low level, and the data sampling cycle starts.

Also in this embodiment, the latch-enable signal is prevented from being generated simultaneously with the read request signal. Moreover, since the divider 40 continues to operate, it is used in common to a divider provided in the peripheral units 160.

The present invention is not limited to the above embodiments, but may be changed and modified without departing from the scope and spirit of the invention. For example, the operating control signal OC can be supplied to each of the comparators 5-0 to 5-7 to activate them only during the high level period of the signal OC.

What is claimed is:

1. An input circuit comprising a set of input terminals supplied with input data consisting of a plurality of bits, means for generating a reference voltage, a comparator circuit comparing a level of each bit of said input data with said reference voltage, dividing means for dividing a clock signal to generate a latch-enable pulse in a predetermined cycle, a latch circuit latching data derived from said comparator circuit in response to said latch-enable pulse, a set of output terminals coupled to a utilization circuit, means responsive to a read signal from said utilization circuit for transferring data latched in said latch circuit to said set of output terminals when said read signal takes an active level, and means coupled to said dividing means for inhibiting said dividing means from dividing said clock signal during said active level of said read signal, whereby said latch-enable pulse is not generated during said active level of said read signal.

2. An input circuit for transferring data to a data processor in response to a request from said data processor, said request from said data processor including address information for accessing said input circuit and a read request signal, said input circuit comprising a set of input terminals supplied with input data consisting of a plurality of bits, means for generating a reference voltage, a comparator circuit comparing a level of each bit of said input data with said reference voltage, a timing circuit cyclically generating a latch-enable pulse, a latch circuit latching data derived from said comparator circuit in response to said latch-enable pulse, a set of output terminals coupled to said data processor, means responsive to said read request signal for transferring data latched in said latch circuit to said set of output terminals, a set of address terminals supplied with said address information, decoding means coupled to said set of address terminals for decoding said address information, and means coupled to said timing circuit and said decoding means for delaying generation of said latch-enable pulse when said address information represents that said input circuit is to be accessed, wherein the generation of said latch-enable pulse is delayed such that said latch-enable pulse is generated after said read request signal disappears.

3. An input circuit comprising a set of input terminals supplied with input data consisting of a plurality of bits, a sample-hold circuit coupled to said set of input terminals for sampling and holding a voltage level of each bit of said input data, means for generating a reference voltage, a comparator circuit coupled to said sample-hold circuit and said generating means for comparing the voltage level from said sample-hold circuit with said reference voltage, a timing circuit cyclically generating a latch-enable pulse, a latch circuit latching data derived from said comparator circuit in response to said latch-enable pulse, a set of output terminals, means responsive to a read signal for transferring data latched in said latch circuit to said set of output terminals, and means coupled to said timing circuit for delaying generation of said latch-enable pulse such that said latch-enable pulse is generated after said read signal disappears.

4. The input circuit as claimed in claim 3, wherein said timing circuit further generates an operating control signal which cyclically changes between a first logic level and a second logic level, said first logic level being one of logic high and logic low levels and said second logic level being the other of said logic high and logic low levels, said sample-hole circuit sampling the voltage level of each bit of said input data when said operating control signal takes said first logic level and holding the voltage level of each bit of said input data when said operating control signal takes said second logic level.

5. The input circuit as claimed in claim 4, wherein said latch-enable pulse is generated by said timing circuit just before said operating control signal changes from said second logic level to said first logic level.

6. An input circuit comprising a set of input terminals supplied with input data consisting of a plurality of bits, a potential source generating a plurlity of reference voltages, a multiplexer selecting one of said reference voltages and outputting the selected reference voltage, a comparator circuit comparing a level of each bit of said input data with said selected reference voltage, a timing circuit cyclically generating a latch-enable pulse, a latch circuit latching data derived from said comparator circuit in response to said latch-enable pulse, a set of output terminals, means responsive to a read signal for transferring data latched in said latch circuit to said set of output terminals level, and means coupled to said timing circuit for delaying generation of said latch-enable pulse such that said latch-enable pulse is generated after said read signal disappears.

7. A data processing equipment comprising a central processing unit; an input port supplied with input data; a data bus interconnecting said central processing unit and said input port; and an address bus interconnecting said central processing unit and said input port; said central processing unit outputting address data to said address bus to access said input port and supplying a read signal to said input port to receive said input data via said input port and said data bus; said input port including at least on input terminal supplied with said input data, means for generating a reference voltage, a comparator coupled to said input terminal and said generating means for comparing a level of said input data with said reference voltage to produce logic data, a timing circuit cyclically generating a latch-enable pulse, a latch circuit latching said logic data from said comparator in response to said latch-enable pulse, a buffer circuit transferring data latched in said latch circuit to said data bus in response to said read signal, a decoder decoding said address data and producing a decoded signal when said address data has information representing that said central processing unit accesses said input port, and means responsive to said decoded signal for delaying generation of said latch-enable pulse such that said latch-enable pulse is generated after said read signal disappears.

8. An input circuit for receiving input data from the outside thereof and for transferring said input data to a data processor in response to a request from said data processor, said input circuit comprising at least one input terminal to which said input data is applied from the outside of said input circuit, a latch circuit having at least one input node and at least one output node and latching data at said input node therein in response to a latch-enable pulse, means for coupling said input terminal to said input node of said latch circuit, a timing circuit generating said latch-enable pulse in a predetermined cycle when said request from said data processor is absent, means responsive to said request from said data processor for coupling said output node of said latch circuit to said data processor to transfer the data latched in said latch circuit to said data processor, and means coupled to said timing circuit for inhibiting said latch-enable pulse from being generated during said request from said data processor by detecting said request from said data processor to prevent the data latched in said latch circuit from being changed during said request from said data processor, said timing circuit including a divider receiving a clock signal, said divider dividing said clock signal to generate said latch-enable signal, said inhibiting means including gate means for preventing said clock signal from being supplied to said divider during said request from said data processor.

9. An input circuit for receiving input data from the outside of said input circuit and for transferring said input data to a data processor in response to a request from said data processor, said input circuit comprising at least one input terminal to which said input data is applied from the outside of said input circuit, a latch circuit having at least one input node and at least one output node and latching data at said input node therein in response to a latch-enable pulse, means for coupling said input terminal to said input node of said latch circuit, a timing circuit generating said latch-enable pulse in a predetermined cycle when said request from said data processor is absent, means responsive to said request from said data processor for coupling said output node of said latch circuit to said data processor to transfer the data latched in said latch circuit to said data processor, and means coupled to said timing circuit for inhibiting said latch-enable pulse from being generated during said request from said data processor by detecting said request from said data processor to prevent the data latched in said latch circuit from being changed during said request from said data processor, said timing circuit including means for dividing a clock signal to produce a control signal in said predetermined cycle irrespective of the presence or absence of said request from said data processor and means, when activated, for creating said latch-enable pulse in response to said control signal, said inhibiting means including means for activating said creating means when said request from said data processor is absent and for inactivating said creating means during said request from said data processor and means for storing the control signal which is produced by said dividing means during said request from said data processor, said storing means outputting the stored control signal to said creating means after said request from said data processor disappears so that said creating means creates said latch-enable pulse in response to said stored control signal.

* * * * *